United States Patent [19]

Gersdorf et al.

[11] Patent Number: 5,041,357

[45] Date of Patent: Aug. 20, 1991

[54] RADIATION-POLYMERIZABLE MIXTURE AND RECORDING MATERIAL CONTAINING IT

[75] Inventors: Joachim Gersdorf, Wiesbaden; Hans-Jerg Kleiner, Kronberg, both of Fed. Rep. of Germany

[73] Assignee: Hoechst Aktiengesellschaft, Frankfurt am Main, Fed. Rep. of Germany

[21] Appl. No.: 547,298

[22] Filed: Jul. 3, 1990

[30] Foreign Application Priority Data

Jul. 7, 1989 [DE] Fed. Rep. of Germany ....... 3922330

[51] Int. Cl.$^5$ .............................................. G03C 1/492
[52] U.S. Cl. .................................. 430/277; 430/271; 430/281; 430/288; 522/64
[58] Field of Search ............... 430/281, 288, 277, 271; 522/64

[56] References Cited

U.S. PATENT DOCUMENTS 2,892,716 6/1959 Martin .................................... 96/115
3,297,663 1/1967 Herbst et al. .......................... 260/80

*Primary Examiner*—Jack P. Brammer
*Attorney, Agent, or Firm*—Foley & Lardner

[57] ABSTRACT

Esters of dihydric alcohols with alkenylphosphonic or alkenylphosphinic acids which are polymerizable by free radicals are described. They are combined with polymer binders, in particular water-soluble polymers, and photoinitiators forming free radicals to give photopolymerizable mixtures which are suitable for the production of photoresists and printing plates. The mixtures display low heat-sensitivity and have long shelf lives.

12 Claims, No Drawings

RADIATION-POLYMERIZABLE MIXTURE AND RECORDING MATERIAL CONTAINING IT

BACKGROUND OF THE INVENTION

The invention relates to a radiation-polymerizable mixture comprising a polymer binder, a compound polymerizable by free radicals and a compound capable of initiating the polymerization of the polymerizable compound under the influence of actinic radiation and to a recording material containing this radiation-sensitive mixture.

Photopolymerizable mixtures for the production of printing plates, photoresists and other light-sensitive materials contain compounds which can be polymerized by free radicals and polymerize upon exposure to light in the presence of a photoinitiator to give cross-linked insoluble products. Compounds of this type have previously been almost exclusively esters of unsaturated carboxylic acids, in particular of acrylic and methacrylic acid, with polyhydric aliphatic or cycloaliphatic alcohols which, if desired, may contain urethane or ether groups. In prior publications, for example in U.S. Pat. No. 2,892,716, divinyl esters of aromatic or aliphatic disulfonic acids are also mentioned as polymerizable compounds. However, these compounds have not been introduced into practice.

The previously preferred (meth)acrylates of polyhydric alcohols have, at least for some applications, specific disadvantages. They are unstable at elevated temperatures, for example above 150° C. Many of the low-molecular-weight representatives are highly volatile, and this volatility becomes noticeable in the layer upon prolonged storage and during processing at elevated temperatures. Moreover, the majority of the preferred representatives are water-insoluble and thus more difficult to combine with water-soluble or hydrophilic binders. In addition, most (meth)acrylates caused troublesome irritations of the skin.

Esters and other derivatives of alkenylphosphonic and alkenylphosphinic acids with mainly monohydric alcohols are known and are used on a large scale for the preparation of polymers, for example of polyvinylphosphonic acid and its derivatives. The unsaturated compounds mentioned have hitherto been utilized directly—except for the preparation of polymers—only to a small extent, in which virtually only the acidic properties of the monomers were utilized without making use of the polymerizability of the alkenyl group. This can be probably explained by the relatively low polymerization tendency of the known alkenylphosphonic acids or their derivatives (DE-B 1,106,963/1,135,176 = U.S. Pat. No. 3,297,663).

Nevertheless, the prior German Patent Application P 3,817,424.8 has described radiation-curable mixtures containing alkenylphosphonic and -phosphinic esters of 1,1,1-tris(hydroxymethyl)alkanes and 2,2-bis(hydroxymethyl)-1,3-propanediol as monomers.

SUMMARY OF THE INVENTION

Accordingly, it is an object of the present invention to provide a radiation-polymerizable mixture whose polymerizability upon irradiation in the presence of radiation-activatable polymerization initiators, in particular photoinitiators, is as good as that of the acrylic and methacrylic esters hitherto used commercially, and which contains polymerizable compounds which are water-soluble, have low volatility and are less skin-irritating.

Another object of the present invention is to provide a radiation-sensitive recording material comprising the foregoing radiation-polymerizable mixture.

In accomplishing the foregoing objectives, there has been provided, in accordance with one aspect of the present invention, a radiation-polymerizable mixture which comprises
a) a polymer binder,
b) a compound polymerizable by free radicals and
c) a compound or combination of compounds capable of initiating the polymerization of compound b) under the influence of actinic radiation,
wherein the compound polymerizable by free radicals is an alkenylphosphonic or -phosphinic ester of the general formula I

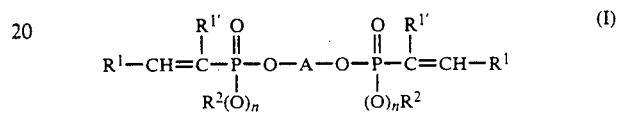

in which
R$^1$ and R$^{1'}$, independently of one another, are hydrogen or (C$_1$-C$_4$)-alkyl,
R$^2$ is (C$_1$-C$_4$)-alkyl,
n is 0 or 1 and
A is straight-chain or branched (C$_2$-C$_{12}$)-alkylene or a group of the formula II

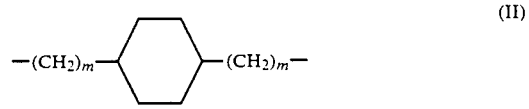

in which m is 0 or 1, or a group of the formula III

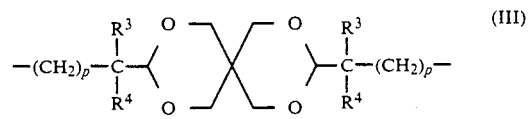

in which R$^3$ and R$^4$, independently of one another, are (C$_1$-C$_4$)-alkyl and p is 0 or 1, or a group of the formula IV

in which x is 1 to 12, or a group of the formula V

in which y is 1 to 12, or a group of the formula VI

in which B is straight-chain or branched (C$_3$-C$_{12}$)-alkylene and R$^1$, R$^{1'}$, R$^2$ and n are as defined above.

In accordance with another aspect of the present invention there is provided a radiation-sensitive recording material which comprises a substrate and a radiation-sensitive layer comprising the foregoing radiation-polymerizable mixture.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS $R^1$ and $R^{1'}$ are preferably hydrogen or methyl, in particular hydrogen.

$R^2$ is preferably methyl, ethyl or propyl, in particular methyl or ethyl.

An alkylene group A or B preferably has 3 to 8 carbon atoms.

In the group of the formula III, $R^3$ and $R^4$ are preferably methyl and ethyl. In the groups of the formulae IV and V, x and y are preferably 1 to 4.

A preferably represents compounds of the formula II in which m is 0 or compounds of the formula IV in which x is 1 to 3, in particular 2, or compounds of the formula V in which y is 1 to 3, in particular 2, or compounds of the formula VI in which B is a straight-chain $(C_3-C_6)$-alkylene, in particular $C_3$- or $C_4$-alkylene.

A is particularly preferably 1,3-propylene, 1,4-butylene, 1,6-hexylene, 2,5-hexylene, 2,2-dimethyl-1,3-propylene, 1,4-cyclohexylene,2-methyl-2,4-pentylene and represents the radicals derived from diethylene glycol, triethylene glycol and dipropylene glycol.

The compounds as such and the process for their preparation are described in German Patent Application P 39 22 327.2 (int. No. 551). The preparation is based on the reaction of an alkenylchlorophosphonic ester of the general formula VII

or an alkenylphosphinyl chloride of the general formula VIII

in which $R^1$, $R^{1'}$ and $R^2$ are as defined above with an alcohol of the general formula IX

or with an alcohol of the general formula X

in which A and B are as defined above.

In order to bind the hydrogen chloride released during the reaction, preferably suitable tertiary amines are used as acid scavengers.

Examples of suitable tertiary amines are trialkylamines having 1 to 4 carbon atoms per alkyl radical, such as, for example, triethylamine, dialkyanilines having 1 to 4 carbon atoms in the alkyl radical, such as, for example, N,N'-dimethylaniline and pyridine.

Preferably, the reactions are carried out at molar ratios of organophosphorus compounds:acid scavenger:alcohol of the general formula IX of 2:2:1 or organophosphorus compounds:acid scavenger:alcohol of the general formula X of 3:3:1.

The reactions are preferably carried out with cooling at $-10°$ C. to $+40°$ C. in suitable inert solvents.

Examples of suitable inert solvents are halogenated hydrocarbons, such as, for example, methylene chloride, aromatic hydrocarbons, such as, for example, toluene, ethers, such as, for example, tetrahydrofuran or aliphatic nitriles, such as, for example, acetonitrile.

The products formed in the processes mentioned can in some cases be purified by distillation, in particular by means of a thin-film evaporator, in a high vacuum. However, in other cases they can also be directly further processed.

The alcohols of the general formulae IX and X are known and commercially available or can be prepared by known methods. Examples of dihydric alcohols of the general formula IX are 1,3-propanediol, 1,4-butanediol, 1,6-hexanediol, 2,5-hexanediol, 2,2-dimethyl-1,3-propanediol, 2-methyl-2,4-pentanediol,1,4-cyclohexanediol, diethylene glycol, triethylene glycol and dipropylene glycol.

Examples of trihydric alcohols of the general formula X are glycerol and 1,2,6-hexanetriol.

The organophosphorus compounds of the general formulae VII and VIII are commercially available or accessible by conventional methods (for example Houben-Weyl, Methoden der Organischen Chemie [Methods of Organic Chemistry], Georg Thieme Verlag, Stuttgart, Vol. 12/1, 1963, pages 217 ff and 338 ff).

A preferred compound of the general formula VII is ethyl vinylchlorophosphonate and one such compound of the general formula VIII is methylvinylphosphinyl chloride.

An essential advantage of the compounds according to formula I contained in the mixture polymerizable by radiation according to the invention is their very high solubility not only in polar but also in nonpolar solvents. Thus, these monomers, in contrast to trimethylolpropane triacrylate or trimethylolpropane trimethacrylate, are water-miscible. The monomers mentioned are nonvolatile, almost odorless substances. This also leads to a substantially lessened tendency for diffusion or evaporation from the photopolymerizable layers. In addition, these compounds are distinguished by a significantly higher heat stability than the customary acrylic and methacrylic esters.

The relative amount of the monomers of the general formula I in the radiation-polymerizable layer is in general about 5 to 80, preferably 8 to 60, % by weight, relative to the non-volatile components of the layer.

A large number of soluble organic polymers can be used as binder in the radiation-polymerizable mixture according to the invention. Examples are: polyamides, polyvinyl esters, polyvinyl acetals, epoxy resins, polyacrylic esters, polymethacrylic esters, polyesters, alkyl resins, polybutadiene, polyisoprene, isoprene/styrene block copolymers and other elastomers and also mixed polymers of the monomers forming the homopolymers listed.

Likewise, binders which are water-insoluble but are soluble or at least swellable in aqueous-alkaline solutions can also be used, since layers containing these types of binders can be developed by means of aqueous-alkaline developers. Such binders can contain, for example, the following groups: —COOH; —PO$_3$H$_2$; —SO$_2$NH—; —SO$_2$—NH—SO$_2$— and —SO$_2$—N-H—CO—.

Examples of these compounds are: maleate resins, polymers of β-(methacryloyloxy)ethyl N-(p-tolylsulfonyl)carbamate and mixed polymers of these and similar monomers with other monomers, vinyl acetate/crotonic acid, styrene/-maleic anhydride, alkyl methacrylate/methacrylic acid, higher alkyl methacrylates and methyl methacrylate and/or styrene or acrylonitrile.

Particularly advantageously, mixtures based on water-soluble binders are used, since the water-soluble polymerizable compounds according to the invention can be combined with these with particular ease and allow a convenient and environmentally safe coating from aqueous solution. Examples of these binders are polyvinyl alcohol, partially hydrolyzed polyvinyl acetals and vinyl acetate mixed polymers, polyvinyl ether, polyvinylpyrrolidone, polyacrylamide, polydimethylacrylamide, polyethylene oxide, polyvinylmethylformamide, polyvinylmethylacetamide and water-soluble natural polymers.

The amount of the binder is in general about 20 to 95, preferably 40 to 90, % by weight, relative to the non-volatile components of the layer.

Depending on the intended use and the desired properties, the radiation-polymerizable mixture according to the invention can contain various substances as additives. Examples are: polymerization inhibitors, hydrogen donors, dyes, colored and uncolored pigments and plasticizers.

In the context of this description, actinic radiation is understood to mean any radiation whose energy corresponds at least to that of visible light. Suitable forms are, inter alia, visible light, long-wave and short-wave UV radiation, laser radiation, electron and X-ray radiation.

A large number of substances can be used as photoinitiators in the mixture according to the invention. Examples are those derived from the basic structure of benzophenones, acetophenones, benzoins, benzils, benzil monoketals, fluorenone, thioxanthone, polynuclear quinones, acridines and quinoxalines; furthermore trichloromethyl-s-triazines, halogenooxazoles substituted by 2-halogenomethyl groups, carbonylmethylene heterocycles containing trihalogenomethyl groups according to DE-A 3,333,450 or acylphosphine oxide compounds, such as are described, for example, in DE-A 3,133,419.

The initiators are in general used in an amount of about 0.01 to 10, preferably 0.05 to 4, % by weight, relative to the non-volatile components of the mixture.

If the image formation is carried out by means of X-rays or electron beams, suitable photoinitiators in addition to the known photoinitiators which are sensitive to visible and near UV light are also those whose absorption ranges are in the short-wave region of the electromagnetic spectrum and are therefore not very sensitive to daylight. This has the advantage that the recording materials can be handled without having to exclude light and that a longer shelf life of the materials can be achieved. Examples of these initiators are tribromomethyl phenyl sulfone, 2,2', 4,4', 6,6'-hexabromodiphenylamine, pentabromoethane, 2,3,4,5-tetrachloroaniline, tetrabromopentaerythritol, chloroterphenyl resins or chlorinated paraffins.

The photopolymerizable mixture can be used for a wide range of applications, for example for the preparation of varnishes to be cured by light, as tooth-filling or replacement material and in particular as light-sensitive recording materials in the reproduction sector. The detailed description of the invention is limited to this area of application, but the invention is not limited thereto.

Possible applications in the reproduction sector are: recording layers for the photomechanical manufacture of printing plates for letterpress printing, in particular flexographic printing, planographic printing, gravure printing, screen printing, of relief copies, for example, preparation of texts in Braille, of individual copies, dye images, pigment images and the like. Furthermore, the mixtures can be used for the photomechanical production of etch resists, for example for the manufacture of name tags, of copied circuits and for the etching of molded articles. The mixtures according to the invention are of particular importance as copying layers for the photomechanical production of printing plates and for the photoresist technique.

The commercial utilization of the mixture according to the invention for the applications mentioned can be carried out in the form of a liquid solution or dispersion, for example as a photoresist solution which is applied, for example, for the etching of molded articles, for the production of copied circuits or for screen printing stencils and the like. The mixture according to the invention can also be applied as a solid light-sensitive layer on a suitable substrate in the form of a light-sensitive copying material which has been precoated to provide stability, for example for the production of printing plates. Likewise, it is suitable for the production of dry resists.

According to the invention, a radiation-polymerizable recording material containing a radiation-polymerizable mixture applied to a substrate according to the above-mentioned details is therefore also proposed.

It is in general advantageous to thoroughly protect the recording material according to the invention during the imagewise exposure against the effect of air oxygen. In the case where it is used in the form of very thin recording layers, it is recommended to coat the radiation-sensitive layer with a suitable surface film which has low permeability for oxygen and can be pulled off mechanically or is soluble in a developer.

Examples of suitable substrates for the recording material according to the invention are aluminum, steel, zinc, copper and plastic sheets, for example made of polyethylene terephthalate or cellulose acetate, and also screen-printing substrates such as Perlon gaze. In many cases, it is advantageous to subject the substrate surface to a pretreatment (chemically or mechanically), with the goal of adjusting the adhesion of the layer properly or to reduce the reflectivity of the substrate in the actinic region of the copying layer (anit-halation layer).

The production of the radiation-photopolymerizable recording materials using the mixture according to the invention is carried out in a known manner. Thus, the latter can be taken up in a solvent, and the solution or dispersion can be applied to the intended substrate by pouring, spraying, dipping, roller application and the like, and then dried. Thick layers (for example 250 μm or more) are advantageously produced by extrusion or pressing in the form of a self-supporting sheet, which is then, if desired, laminated onto a substrate. In the case of dry resists, solutions of the mixture are applied to transparent substrates and dried. The light-sensitive layers—between about 10 and 100 μm in thickness—are likewise first laminated together with a temporary support to the desired substrate.

The radiation-sensitive polymerizable recording materials are processed in a known manner. To achieve better crosslinking of the radiation-sensitive layer, it can be heated after the irradiation. It is then developed by treatment with a suitable developer fluid, for example with organic solvents, with weakly alkaline aqueous solutions or advantageously with water on its own, which removes the unirradiated portions of the layer and leaves the exposed regions of the copying layer behind on the substrate.

In what follows, preparation and working examples for the invention are described. In these examples, percentages and relative amounts are by weight, unless stated otherwise. The monomers according to the formula I contained in the radiation-polymerizable mixture according to the invention are listed in Table I.

PREPARATION EXAMPLE 1

Reaction of methylvinylphosphinyl chloride with 1,4-butanediol 36 g (0.4 mol) of 1,4-butanediol were added together with 81 g (0.8 mol) of trietghylamine to 270 ml of toluene. With vigorous stirring, 99.6 (0.8 mol) of methylvinyl-phosphinyl chloride were added dropwise at 20°–25° C. with cooling. Stirring was then continued for 20 hours, and the triethylamine hydrochloride formed was subsequently filtered off with suction. The precipitate was washed with toluene, and the filtrate was freed from toluene by distillation in vacuo. The residue was distilled at 0.093 kPa and a bath temperature of 190° C. through a thin-film evaporator to give 92 g, $n_D^{20}$:1.4805. The yield was 87% of theory.

$C_{10}H_{20}O_4P_2$ (266) calculated: 45.11% C; 7.52% H; 23.31% P: found: 45.1% C; 7.4% H; 22.9% P.

PREPARATION EXAMPLE 2

Reaction of methylvinylphosphinyl chloride with 1,6-hexanediol 59.1 g (0.5 mol) of 1,6-hexanediol were added together with 101 g (1 mol) of triethylamine to 200 ml of toluene. With vigorous stirring, 124.5 g (1 mol) of me- thylvinyl-phosphinyl chloride were added dropwise at 20° C. with cooling. Stirring was then continued for 18 hours, and the triethylamine hydrochloride formed was subsequently filtered off with suction. The precipitate was washed with toluene, and the filtrate was freed from toluene by distillation in vacuo. The residue was distilled at 0.067 kPa and a bath temperature of 205° C. through a thin-film evaporator to give 135 g, $n_D^{20}$:1.4819. The yield was 92% of theory.

$C_{12}H_{24}O_4P_2$ (294) calculated: 48.98% C; 8.16% H; 21.09% P: found: 48.9% C; 8.3% H; 21.0% P.

PREPARATION EXAMPLE 3

Reaction of methylvinylphosphinyl chloride with 2,5-hexanediol 59.1 g (0.5 mol) of 2,5-hexanediol were added together with 101 g (1 mol) of triethylamine to 200 ml of toluene. With vigorous stirring, 124.5 g (1 mol) of methylvinyl-phosphinyl chloride were added dropwise at 20° C. with cooling. Stirring was then continued for 18 hours, and the triethylamine hydrochloride formed was subsequently filtered off with suction. The precipitate was washed with toluene, and the filtrate was freed from toluene by distillation in vacuo. The residue was distilled at 0.2 kPa and a bath temperature of 200° C. through a thin-film evaporator to give 130 g. The product formed had an acid number of 44. It was crude a product. The yield was 92% of theory.

$C_{12}H_{24}O_4P_2$ (294)

PREPARATION EXAMPLE 4

Reaction of methylvinylphosphinyl chloride with 2,2-dimethyl-1,3-propanediol 15.6 g (0.15 mol) of the 2,2-dimethyl-1,3-propanediol were added together with 30.4 g (0.3 mol) of triethylamine to 75 ml of toluene. With vigorous stirring, 37.35 g (0.3 mol) of methylvinylphosphinyl chloride were added dropwise at 20°–25° C. with cooling. Stirring was then continued, and the triethylamine hydrochloride formed was subsequently filtered off with suction. The precipitate was washed with toluene, and the filtrate was freed from toluene in vacuo. 40 g remained. The product formed had an acid number of 49. It was a crude product. The yield was 97% of theory.

$C_{11}H_{16}O_4P_2$ (274)

PREPARATION EXAMPLE 5

Reaction of methylvinylphosphinyl chloride with 1,4-cyclohexanediol 23.2 g (0.2 mol) of 1,4-cyclohexanediol were added together with 40.5 g (0.4 mol) of triethylamine to 90 ml of toluene. With vigorous stirring, 49.8 g (0.4 mol) of methylvinylphosphinyl chloride were added dropwise at 20° C. with cooling. Stirring was then continued, and the triethylamine hydrochloride formed was filtered off with suction. The precipitate was washed with toluene, and the filtrate was freed from toluene by vacuum distillation. The residue crystallized. The product was recovered by stirring it in ethyl methyl ketone. Melting point: 80° to 82° C.

$C_{12}H_{22}O_4P_2$ (292) calculated: 49.32% C; 7.53% H; 21.23% P: found: 48.52% C; 8.02% H; 21.0% P.

PREPARATION EXAMPLE 6

Reaction of methylvinylphosphinyl chloride with triethylene glycol 37.6 g (0.25 mol) of triethylene glycol were added together with 50.6 g (0.5 mol) of triethylamine to 100 ml of toluene. With vigorous stirring, 62.25 g (0.5 mol) of methylvinylphosphinyl chloride were added dropwise at 20° C. with cooling. Stirring was continued, and the triethylamine hydrochloride formed was filtered off with suction. The precipitate was washed with toluene, and the filtrate was freed from toluene by vacuum distillation. The residue was distilled at 0.027 kPa and a bath temperature of 240°–245° C. through a thin-film evaporator to give 65 g, $n_D^{20}$:1.4843. The yield was 80% of theory.

$C_{12}H_{24}O_6P_2$ (326) calculated: 44.17% C; 7.36% H; 19.02% P: found: 44.4% C; 7.4% H; 18.8% P.

PREPARATION EXAMPLE 7

Reaction of methylvinylphosphinyl chloride with dipropylene glycol (mixture of isomers)

33.6 g (0.25 mol) of dipropylene glycol (mixture of isomers) were added together with 50.6 g (0.5 mol) of triethylamine to 100 ml of toluene. With vigorous stirring, 62.25 g (0.5 mol) of methylvinylphosphinyl chloride were added dropwise at 20° C. over a period of 1.5 hours with cooling. Stirring was continued for 18 hours. The triethylamine hydrochloride formed was then filtered off with suction. The precipitate was washed with toluene, and the filtrate was freed from toluene by vacuum distillation to give 77.5 g of crude product, $n_D^{20}$:1.4768. Purification by distillation in a thin-film evaporator at a bath temperature of about 220° C. and 0.027 kPa was possible. The yield was 100% of theory.

$C_{12}H_{24}O_5P_2$ (310) calculated: 46.45% C; 7.74% H; 20.00% P: found: 46.4% C; 7.7% H; 19.8% P.

PREPARATION EXAMPLE 8

Reaction of ethyl vinylchlorophosphonate with 1,6-hexanediol 28.6 g (0.242 mol) of 1,6-hexanediol were added together with 49 g (0.484 mol) of triethylamine to 100 ml of toluene. With vigorous stirring, 74.9 g (0.484 mol) of ethyl vinylchlorophosphonate were added dropwise at 20° C. with cooling. Stirring was continued, and the triethylamine hydrochloride formed was filtered off with suction. The precipitate was washed with toluene, and the filtrate was freed from toluene by cacuum distillation to give 84 g. Purification by distillation in a thin-film evaporator at a bath temperature of 250°-260° C.

and 0.04 kPa was possible, $n_D^{20}$:1.4623. The yield was 98% of theory.

$C_{14}H_{28}O_6P_2$ (354) calculated: 47.46% C; 7.91% H; 17.51% P: found: 47.4% C; 7.8% H; 17.4% P.

PREPARATION EXAMPLE 9

Reaction of methylvinylphosphinyl chloride with glycerol 9.2 g (0.1 mol) of glycerol were added together with 30.4 g (0.3 mol) of triethylamine to 70 ml of acetonitrile. With vigorous stirring, 37.4 g (0.3 mol) of methylvinylphosphinyl chloride were added dropwise at 20°-25° C. over a period of 45 minutes with cooling. Stirring was then continued for 20 hours, and the triethylamine hydrochloride formed was subsequently filtered off with suction. The precipitate was washed with ice-cold acetonitrile, and the filtrate was freed from acetonitrile by vacuum distillation to give 43.5 g, which were again filtered off with suction through a sintered glass crucible, to remove the remaining amount of triethylamine hydrochloride. The filtrate was the crude product. It had an acid number of 140.

$n_D^{20}$:1.4802.

It could be distilled through a thin-film evaporator at a bath temperature of 240° C. and 0.107 kPa.

$C_{12}H_{23}O_6P_3$ (356)

TABLE I (Compounds according to the general formula I)

| Preparation Example | $R^1$ | $R^{1'}$ | $R^2$ | n | A |
|---|---|---|---|---|---|
| 1 | H | H | $CH_3$ | 0 | $-CH_2(CH_2)_2CH_2-$ |
| 2 | H | H | $CH_3$ | 0 | $-CH_2(CH_2)_4CH_2-$ |
| 3 | H | H | $CH_3$ | 0 | $-CH(CH_3)-(CH_2)_2-CH(CH_3)-$ |
| 4 | H | H | $CH_3$ | 0 | $-CH_2-C(CH_3)_2-CH_2-$ |
| 5 | H | H | $CH_3$ | 0 | (cyclohexyl-H) |
| 6 | H | H | $CH_3$ | 0 | $-CH_2CH_2-O-CH_2CH_2-O-CH_2CH_2-$ |
| 7 | H | H | $CH_3$ | 0 | $-C_3H_6-O-C_3H_6-$ (mixture of isomers) |
| 8 | H | H | $C_2H_5$ | 1 | $-CH_2(CH_2)_4CH_2-$ |
| 9 | H | H | $CH_3$ | 0 | $-CH_2-CH(O-P(=O)(CH_3)-CH=CH_2)-CH_2-$ |

WORKING EXAMPLE 1

145.5 g of an internally plasticized vinyl alcohol copolymer with a viscosity of 4 mPa in 4% aqueous solution at 20° C. and an ester number of 150 were dissolved with stirring in 147 g water at 90° C. After cooling to 70° C., 100 g of the compound from Preparation Example 1, 5 g benzil dimethyl ketal and 1 g 2,6-di-tert.-butyl-4-methylphenol were added with stirring. The homogeneous solution was applied to a 0.125 mm thick polyethylene terephthalate sheet in the form of a layer in such a manner that after drying at room temperature for 48 hours an approximately 1 mm thick non-adhesive light-sensitive layer was formed. A 0.3 mm thick aluminum sheet coated with a polyurethane primer according to DE-A 1,597,515 was then placed on the exposed layer surface, and the multi-layer element was compressed in a platen press at 100° C. for 2 minutes. The primer was obtained by reacting a branched polyester consisting of adipic acid, glycerol and butylene glycol containing 5.2% of OH groups with 4,4',4''-triisocyanatotriphenylmethane. The thickness of the spaced pieces was chosen in such a way that a 0.6 mm thick photopolymer layer was obtained after the hot pressing. After the polyester sheet had been pulled off, the light-sensitive layer was subjected to imagewise exposure for 20 minutes using a commercially available UVA flat exposure apparatus (emitted wavelength region 320 to 400 nm, intensity 10 mW/cm$^2$). After washing the unexposed image areas with warm water, a letterpress printing plate having well defined relief structure and a Shore A hardness of 75 was obtained.

WORKING EXAMPLE 2

The preparation of the photopolymer layer and the subsequent processing to give a letterpress printing plate was carried out analogously to Working Example 1, except that this time 100 g of the compound from Preparation Example 2 were used as crosslinkable monomer. A letterpress printing plate having a well defined relief structure and a Shore A hardness of 79 was obtained.

WORKING EXAMPLE 3

The preparation of the photopolymer layer and the subsequent processing to give a letterpress printing plate was carried out analogously to Working Example 1, except that this time 100 g of the compound from Preparation Example 6 was used as crosslinkable monomer. A letterpress printing plate having a well defined relief structure and a Shore A hardness of 98 was obtained.

WORKING EXAMPLE 4

The preparation of the photopolymer layer and the subsequent processing to give a letterpress printing plate was carried out analogously to Working Example 1, except that this time 100 g of the compound from Preparation Example 7 was used as crosslinkable monomer, and the exposure time was 15 minutes. A letterpress printing plate having a well defined relief structure and a Shore A hardness of 98 was obtained.

WORKING EXAMPLE 5

144.4 g of a partially hydrolyzed vinyl acetate graft polymer (43.8% of vinyl alcohol, 13.8 g of vinyl acetate and 42.8% of graft base) on a polyurethane graft base (polyurethane obtained from 3,000 g of polyethylene glycol 600, 193.1 g of 1,4-butanediol and 1,428.2 g of isophorone diisocyanate) were extruded together with a mixture of 50 g of the compound from Preparation Example 8, 4 g of benzil dimethyl ketal and 0.8 g of 2,6-di-tert.-butyl-4-methylphenol at 160° C. and then hot pressed between a 0.125 μm thick polyethylene terephthalate sheet and an aluminum sheet pretreated as described in Example 1 at 130° C. and 35 bar. The further processing of the multi-layer element was carried out as described in Example 1. A letterpress printing plate having a well-defined relief structure and a Shore A hardness of 76 was obtained.

What is claimed is:
1. A radiation-polymerizable mixture comprising:
a) a polymer binder,
b) a compound polymerizable by free radicals and
c) a compound or a combination of compounds capable of initiating the polymerization of compound b) under the influence of actinic radiation,
wherein the compound polymerizable by free radicals is an alkenylphosphonic or -phosphinic ester of the general formula I

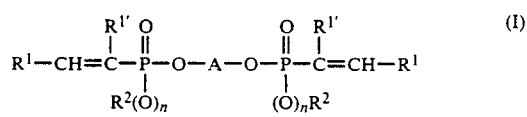

in which
$R^1$ and $R^{1'}$, independently of one another, are hydrogen or $(C_1-C_4)$-alkyl,
$R^2$ is $(C_1-C_4)$-alkyl,
n is 0 or 1 and
A is straight-chain or branched $(C_2-C_{12})$-alkylene or a group of the formula II

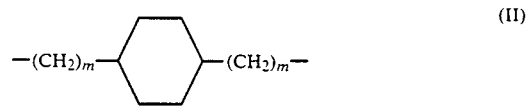

in which m is 0 or 1, or a group of the formula III

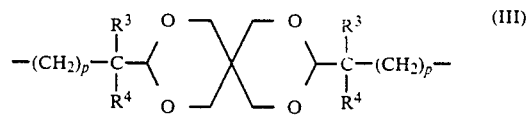

in which $R^3$ and $R^4$, independently of one another, are $(C_1-C_4)$-alkyl and p is 0 or 1, or a group of the formula IV

in which x is 1 to 12, or a group of the formula V

in which y is 1 to 12, or a group of the formula VI

in which B is straight-chain or branched $(C_3-C_{12})$-alkylene and $R^1$, $R^{1'}$, $R^2$ and n are as defined above.
2. A radiation-polymerizable mixture as claimed in claim 1, wherein $R^1$ and $R^{1'}$ are hydrogen or methyl.
3. A radiation-polymerizable mixture as claimed in claim 1, wherein $R^2$ is methyl, ethyl or propyl.
4. A radiation-polymerizable mixture as claimed in claim 1, wherein
A represents a group of the general formula II in which m is 0, or a compound of the general formula IV in which x is 1 to 3, or a compound of the general formula V in which y is 1 to 3, or a compound of the general formula VI in which B is straight-chain $(C_3-C_6)$-alkylene.

5. A radiation-polymerizable mixture as claimed in claim 1, wherein binder (a) is soluble in water or aqueous-alkaline solutions.

6. A radiation-polymerizable mixture as claimed in claim 1, comprising about 25 to 90% by weight of said binder (a), about 5 to 80% by weight of said compound (b) and about 0.01 to 10% by weight of said compound (c), all percentages being relative to the non-volatile components of the mixture.

7. A radiation-polymerizable mixture as claimed in claim 6, comprising 40 to 90% by weight of said binder (a), 8 to 60% by weight of said compound (b) and 0.05 to 4% by weight of said compound (c).

8. A radiation-polymerizable mixture as claimed in claim 1, consisting essentially of the recited ingredients.

9. A radiation-sensitive recording material comprising a substrate and a radiation-sensitive layer comprising a radiation-polymerizable mixture as claimed in claim 1.

10. A radiation-sensitive recording material as claimed in claim 9, wherein said substrate has a surface comprising aluminum, steel, zinc or copper.

11. A radiation-sensitive recording material as claimed in claim 9, wherein said substrate is a plastic sheet.

12. A radiation-sensitive recording material comprising a substrate and a radiation-sensitive layer comprising a radiation-polymerizable mixture as claimed in claim 8.

* * * * *